(12) United States Patent
Chung et al.

(10) Patent No.: US 6,627,976 B1
(45) Date of Patent: Sep. 30, 2003

(54) LEADFRAME FOR SEMICONDUCTOR PACKAGE AND MOLD FOR MOLDING THE SAME

(75) Inventors: Young Suk Chung, Seoul (KR); Hyung Ju Lee, Seoul (KR); Jae Hak Yee, Singapore (SG)

(73) Assignee: Amkor Technology, Inc., Chandler, AZ (US)

( * ) Notice: Subject to any disclaimer, the term of this patent is extended or adjusted under 35 U.S.C. 154(b) by 123 days.

(21) Appl. No.: 09/687,331

(22) Filed: Oct. 13, 2000

(Under 37 CFR 1.47)

(30) Foreign Application Priority Data

Oct. 15, 1999 (KR) ............................................. 99-44646

(51) Int. Cl.[7] .............................................. H01L 23/495
(52) U.S. Cl. ........................ 257/666; 257/670; 257/667
(58) Field of Search ................................ 257/666, 670, 257/667; 438/123; 361/813

(56) References Cited

U.S. PATENT DOCUMENTS

| 4,289,922 A | * | 9/1981 | Devlin ........................ 257/666 |
| 4,530,152 A | | 7/1985 | Roche et al. .................. 29/588 |
| 5,041,902 A | | 8/1991 | McShane ..................... 357/79 |

(List continued on next page.)

FOREIGN PATENT DOCUMENTS

| JP | 57-45959 | 3/1982 |
| JP | 58-101317 | 6/1983 |
| JP | 58-160095 | 9/1983 |
| JP | 61-39555 | 2/1986 |
| JP | 62-9639 | 1/1987 |
| JP | 63-205935 | 8/1988 |
| JP | 63-233555 | 9/1988 |
| JP | 64-54749 | 3/1989 |
| JP | 07-312405 | 11/1995 |
| JP | 08-125066 | 5/1996 |
| JP | 08-306853 | 11/1996 |
| JP | 09-8205 | 1/1997 |
| JP | 09-8206 | 1/1997 |
| JP | 09-8207 | 1/1997 |
| JP | 09-92775 | 4/1997 |
| KR | 92-10286 A | 6/1992 |
| KR | 92-10286 B | 11/1992 |
| KR | 96-9774 A | 3/1996 |
| KR | 96-9774 B | 7/1996 |

*Primary Examiner*—Jasmine J B Clark
(74) *Attorney, Agent, or Firm*—Stetina Bruda Garred & Brucker

(57) ABSTRACT

The invention relates to a leadframe for semiconductor packages and a mold for molding the semiconductor package. The leadframe of the invention reduces occurrences of chip-out and floating of a chip paddle upon singulation after encapsulation. The leadframe inner voids define a chip paddle. At least one end of an inner void extends outwardly beyond a dam bar to provide a flow under pathway for encapsulating material when the leadframe is engaged by a top mold. The top mold has a sill that is continuous, e.g. tetragonal in shape, such that encapsulating material must flow under the sill when the top mold is clamping the leadframe. Encapsulating material is flowed into a mold gate of the leadframe and under a portion of the sill to engulf the semiconductor chip within the cavity formed by the top mold and the leadframe.

20 Claims, 12 Drawing Sheets

U.S. PATENT DOCUMENTS

| | | | |
|---|---|---|---|
| 5,157,480 A | 10/1992 | McShane et al. | 357/74 |
| 5,172,213 A | 12/1992 | Zimmerman | 257/796 |
| 5,172,214 A | 12/1992 | Casto | 257/676 |
| 5,278,446 A | 1/1994 | Nagaraj et al. | 257/707 |
| 5,424,576 A * | 6/1995 | Djennas et al. | 257/666 |
| 5,428,248 A | 6/1995 | Cha | 257/676 |
| 5,517,056 A * | 5/1996 | Bigler et al. | 257/666 |
| 5,521,429 A | 5/1996 | Aono et al. | 257/676 |
| 5,594,274 A * | 1/1997 | Suetaki | 257/667 |
| 5,633,528 A * | 5/1997 | Abbott et al. | 257/666 |
| 5,701,034 A | 12/1997 | Marrs | 257/706 |
| 5,783,861 A | 7/1998 | Son | 253/693 |
| 5,835,988 A | 11/1998 | Ishii | 257/684 |
| 5,866,939 A | 2/1999 | Shin et al. | 257/666 |
| 5,894,108 A | 4/1999 | Mostafazadeh et al. | 174/52.4 |
| 5,977,613 A | 11/1999 | Takata et al. | 257/666 |
| 5,977,630 A | 11/1999 | Woodworth et al. | 257/712 |
| 6,143,981 A | 11/2000 | Glenn | 174/52.4 |
| 6,201,186 B1 * | 3/2001 | Daniels et al. | 257/787 |
| 6,229,200 B1 | 5/2001 | Mclellan et al. | 257/666 |
| 6,242,281 B1 | 6/2001 | Mclellan et al. | 438/106 |
| 6,291,273 B1 * | 9/2001 | Miyaki et al. | 438/123 |
| 6,294,100 B1 | 9/2001 | Fan et al. | 216/14 |
| 6,355,502 B1 | 3/2002 | Kang et al. | 438/110 |

* cited by examiner

LEADFRAME FOR SEMICONDUCTOR PACKAGE AND MOLD FOR MOLDING THE SAME

BACKGROUND OF THE INVENTION

1. Field of the Invention

The present invention relates to a leadframe for semiconductor packages, as well as a combination of a top mold and the leadframe. Further, the present invention relates to a mold for molding the semiconductor package. More particularly, but not by way of limitation, the present invention relates to a leadframe that reduces occurrences of chip-out and floating of a chip paddle upon singulation after encapsulation, and a mold for molding the same.

2. History of Related Art

It is conventional in the electronic industry to encapsulate one or more semiconductor devices, such as integrated circuit dies, or chips, in a semiconductor package. These plastic packages protect a chip from environmental hazards, and provide a method of and apparatus for electrically and mechanically attaching the chip to an intended device. Recently, such semiconductor packages have included metal leadframes for supporting an integrated circuit chip which is bonded to a chip paddle region formed centrally therein. Bond wires which electrically connect pads on the integrated circuit chip to individual leads of the leadframe are then incorporated. A hard plastic encapsulating material, or encapsulant, which covers the bond wire the integrated circuit chip and other components, forms the exterior of the package. A primary focus in this design is to provide the chip with adequate protection from the external environment in a reliable and effective manner.

As set forth above, the semiconductor package therein described incorporates a leadframe as the central supporting structure of such a package. A portion of the leadframe completely surrounded by the plastic encapsulant is internal to the package. Portions of the leadframe extend internally from the package and are then used to connect the package externally. More information relative to leadframe technology may be found in Chapter 8 of the book *Micro Electronics Packaging Handbook*, (1989), edited. by R. Tummala and E. Rymaszewski. This book is published by Van Nostrand Reinhold, 115 Fifth Avenue, New York, N.Y., which is hereby incorporated by reference.

Once the integrated circuit chips have been produced and encapsulated in semiconductor packages described above, they may be used in a wide variety of electronic appliances. The variety of electronic devices utilizing semiconductor packages has grown dramatically in recent years. These devices include cellular phones, portable computers, etc. Each of these devices typically include a motherboard on which a significant number of such semiconductor packages are secured to provide multiple electronic functions. These electronic appliances are typically manufactured in reduced sizes and at reduced costs, consumer demand increases. Accordingly, not only are semiconductor chips highly integrated, but also semiconductor packages are highly miniaturized with an increased level of package mounting density.

According to such miniaturization tendencies, semiconductor packages, which transmit electrical signals from semiconductor chips to motherboards and support the semiconductor chips on the motherboards, have been designed to have a small size. By way of example only, such semiconductor packages may have a size on the order of 1×1 mm to 10×10 mm. Examples of such semiconductor packages are referred to as MLF (micro leadframe) type semiconductor packages and MLP (micro leadframe package) type semiconductor packages. Both MLF type semiconductor packages and MLF type semiconductor packages are generally manufactured in the same manner.

A typical leadframe used in a semiconductor package is comprised of a plate-type metal frame body that is provided with and a tie bar, which is internally extended from each of the four corners. A chip paddle is in contact with the tie bars. A semiconductor chip is mounted on the chip paddle. A plurality of leads are located along and at a distance away from the perimeter of the chip paddle. From the internal leads external leads are extended with their terminals being connected to the frame body. Dam bars 10 are provided between the internal leads and the external leads to prevent a molding material from flowing over the external leads upon encapsulating. The dam bars, the external leads, and predetermined areas of the tie bars and the frame body are all removed in a subsequent singulation process.

After a semiconductor chip is mounted on the chip paddle, the leadframe is positioned between a top mold and a bottom mold and encapsulated by a molding material.

The top mold is designed to clamp the dam bar of the leadframe and a part of the internal leads located at the internal side of the dam bar with the aid of a sill and to provide a cavity on the internal side of the sill in which the semiconductor chip, etc. are encapsulated with the encapsulation material. At one side of the cavity, a mold gate is formed as a passage through which the encapsulation material flows. To discharge the air, gas and dregs of the encapsulation material, (hereinafter referred to as flash), to the outside in the molding process, a plurality of air vents are also provided.

The mold gate is formed to have a space between the tie bar of the leadframe and the upper surface of the body. Because the four corner areas of the leadframe (in which the tie bars are formed) are not clamped by the sill of the top mold and because the mold gate is connected to the cavity, the molding material flows along the upper surface of the leadframe, the upper surface and opposite end sides of the tie bars and the mold gate into the inside of the cavity. Herein, the upper surface of the tie bar and its opposite end sides in the leadframe, with which the molding material is in contact while flowing into the cavity, is defined as a frame gate.

In addition, a mold air vent formed in the top mold is connected to the cavity, so that the molding material flash, gas and air are discharged along the surface of the leadframe, the upper surface and opposite end sides of the tie bar and the mold air vent to the outside in the molding process. Herein, the upper surface of the tie bar and its opposite end sides in the leadframe, with which the flash is in contact while flowing into the cavity, is defined as a mold air vent.

After completion of the encapsulation, a molding material flash is usually formed at the side of the package body. That is, a significant amount of the flash is formed at positions corresponding to the mold gate of the top mold and to the mold air vent, respectively. In addition, the flash is connected to the package body formed inside the cavity. Some flash is removed when the leadframe is ejected from the top mold and the bottom mold.

The flash is not uniform in thickness owing to various factors such as molding pressure, molding period of time, temperature, etc. and, therefore causes problems in the singulation of the leadframe.

The encapsulated semiconductor package is preferably firmly positioned between a bottom clamp and an upper clamp while turning upside down. Thereafter, a boundary area between the internal leads, the dam bars and a predetermined area of the tie bars are cut with the aid of a singulation tool. At this time, any flash present on the tie bars of the leadframe prevents close contact of the semiconductor package with the bottom clamp.

After the singulation tool is allowed to descend, different stresses are generated at the square corners of the semiconductor package, which may result in cracking a part of the package body and even causing a chip-out phenomenon. Once a chip-out occurs, the semiconductor package, even though able to function normally, has a reduced commercial value and thus, is less marketable. Where a serious chip-out phenomenon occurs, wires that connect the semiconductor chip and the internal leads may be cut or the semiconductor chip may be exposed to the outside of the package body.

Because the sill of the top mold clamps only the internal leads and the dam bars during the encapsulation, the pressure of the molding material causes the chip paddle to lean on one side or float, giving rise to an increase in wire sweeping in addition to leaving a significant amount of flash on the bottom surface of the chip paddle. In an MLF package, typically, the internal leads and the chip paddle are externally exposed at their bottom surfaces. Thus, when a flash is formed on the chip paddle, it must be removed or the semiconductor package is regarded defective.

BRIEF SUMMARY OF THE INVENTION

The present invention relates to leadframes for semiconductor packages. More particularly, one aspect of the present invention comprises a semiconductor package, including a frame body and a chip paddle that is defined by inner voids that are formed in the frame body. The leadframe has at least one tie bar that communicates with an outer portion of the frame body with the chip paddle and at least one dam bar in communication with an outer surface of the inner void. In the embodiment presented, at least one end of an inner void extends outwardly beyond the dam bar to provide a flow under pathway for the encapsulating material when the leadframe is engaged by a top mold.

In the above described embodiment of the present invention, the top mold comprises a sill that protrudes from a face of a base plate. The sill defines a cavity and has a contact surface on a distal end of the sill. The sill in continuous such that the cavity is completely enclosed when the contact surface is mated against a flat surface. When the contact surface of the sill engages the leadframe, the sill clamps onto the die bar of the leadframe. In another embodiment, the sill is wider such that the sill engages the dam bar, a plurality of inner leads and a plurality of outer leads of a leadframe when the upper mold engages the leadframe.

The semiconductor chip assembled in accordance with the various embodiments of the present invention is also encapsulated to form a semiconductor package by locating a semiconductor chip on a chip paddle of a leadframe. The leadframe is clamped by the sill of a top mold. Encapsulating material is flowed into a mold gate of the leadframe and under a portion of the sill to engulf the semiconductor chip within the cavity formed by the top mold and the leadframe.

BRIEF DESCRIPTION OF THE DRAWINGS

The above objects and other features and advantages of the present invention will become more apparent after a reading of the following detailed description when taken in conjunction with the drawings, in which:

FIG. 2b is a cross-sectional view of the top mold of FIG. 2 taken along line 2b—2b of FIG. 2a;

FIG. 6b is a cross-sectional view of the top mold of FIG. 6 taken along line 6b—6b of FIG. 6a;

DETAILED DESCRIPTION OF THE INVENTION

Figure 1:
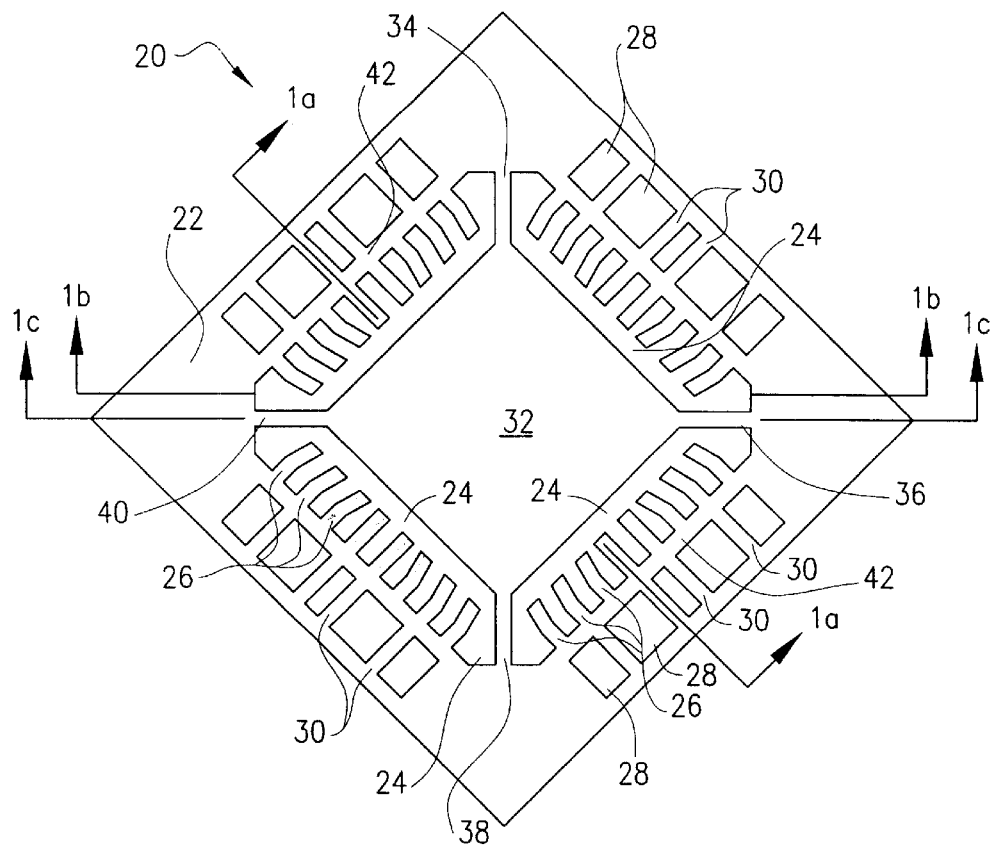
FIG. 1 is a top view of a prior art leadframe.
Figure 1A:
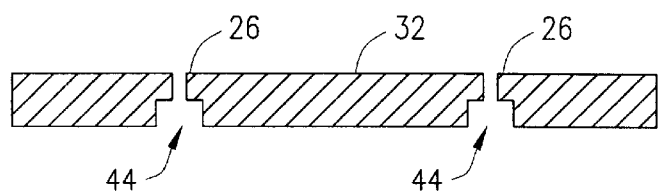
FIG. 1a is a cross-sectional view of the prior art leadframe taken along line 1a—1a of FIG. 1.
Figure 1B:
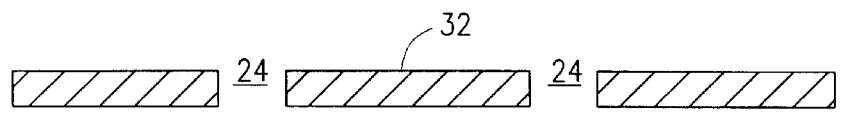
FIG. 1b is a cross-sectional view of the prior art leadframe taken along line 1b—1b of FIG. 1.
Figure 1C:
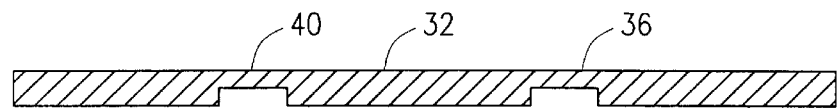
FIG. 1c is a cross-sectional view of the prior art leadframe taken along line 1c—1c of FIG. 1.

Referring first to FIG. 1, there is shown is a prior art leadframe 20 that has a plate type metal frame body 22. Although only a single leadframe 20 is shown, many leadframes may be formed in a larger frame body in a matrix form, e.g. the frame body described in U.S. patent application Ser. No. 09/176,614 which is commonly owned by assignee and which is hereby incorporated by reference. However, other frame body arrangements may be used. By way of example only, frame body 22 is typically a small wafer of metal used in semiconductor package that may have a size on the order of 1×1 mm to 10×10 mm. However, these dimensions are provided as examples only and other dimensions may be used. Portions of frame body 22 are removed from the frame body 22 to create a plurality of voids therein. For example, the prior art leadframe 20 has a plurality of inner voids 24, which define internal leads 26. Leadframe 20 additionally has a plurality of outer voids 28. Outer voids 28 define a plurality of external leads 30. Inner voids 24 define a chip paddle 32, which is typically square. Adjacent inner voids 24 define tie bars 34, 36, 38 and 40, which communicate or make contact with chip paddle 32 with the portion of metal frame body 22 that is outside of inner voids 24. The plurality of internal leads 26 are offset from and surround the perimeter of chip paddle 32. Dam bars 42 are formed between the outer edge of inner voids 24 the inner edge of outer voids 28. Dam bars 42 are provided to prevent molding material from flowing over the external leads 30 upon encapsulating. The dam bars 42, external leads 30, portions of tie bars 34 through 40 and the frame body 22 are all removed in a singulation process. Leadframe 20 has a groove 44 formed on its underside. Groove 44 can be seen in a cross section of FIG. 1, taken along line 1a—1a, which is shown in FIG. 1a. Additionally, groove 44 may be seen in FIG. 1c, which is a cross sectional view taken along line 1c—1c. Line 1c—1c cuts through tie bars 36 and 40. Groove 44 can be seen passing beneath tie bars 36 and 40 in FIG. 1c. FIG. 1b shows a cross sectional view of prior art leadframe 20 taken along lines 1b—1b in FIG. 1. Line 1b—1b passes through inner void 24 proximate tie bars 36 and 40.

Figure 2:
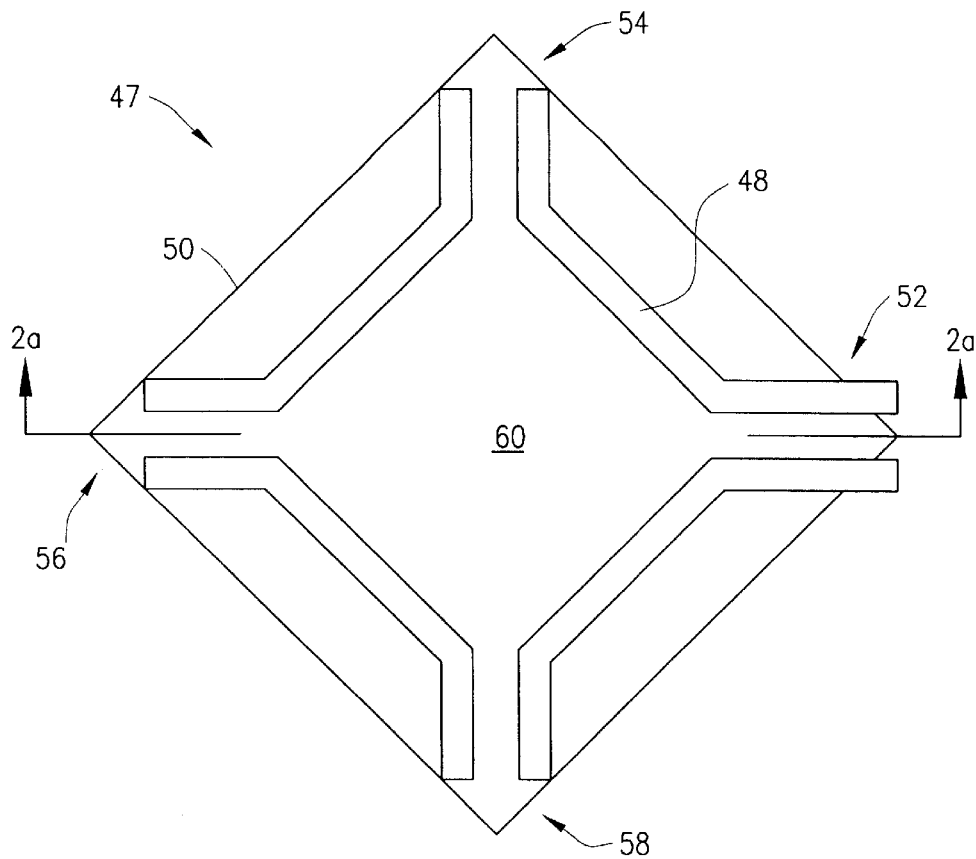
FIG. 2 is a bottom plan view of a prior art top mold in an encapsulation process during the manufacture of a semiconductor package.
Figure 2A:
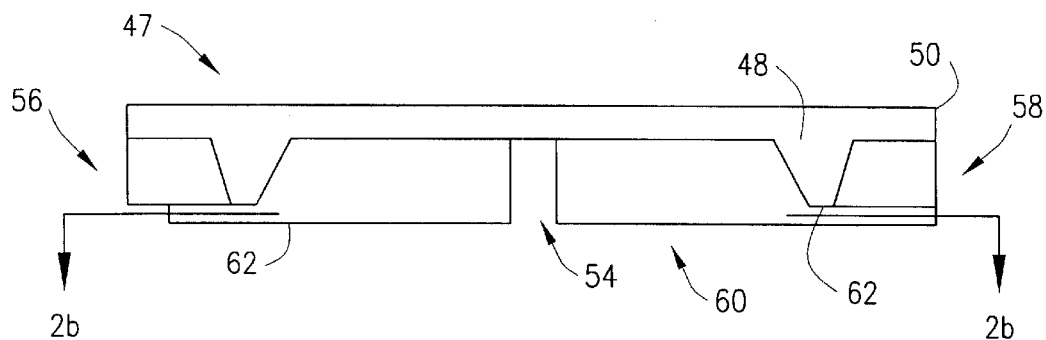
FIG. 2a is a cross-sectional view of the top mold of FIG. 2 taken along line 2a—2a of FIG. 2.
Figure 2B:
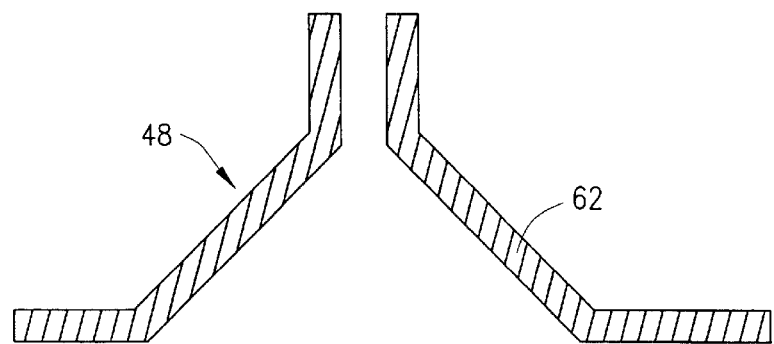
Figure 3:
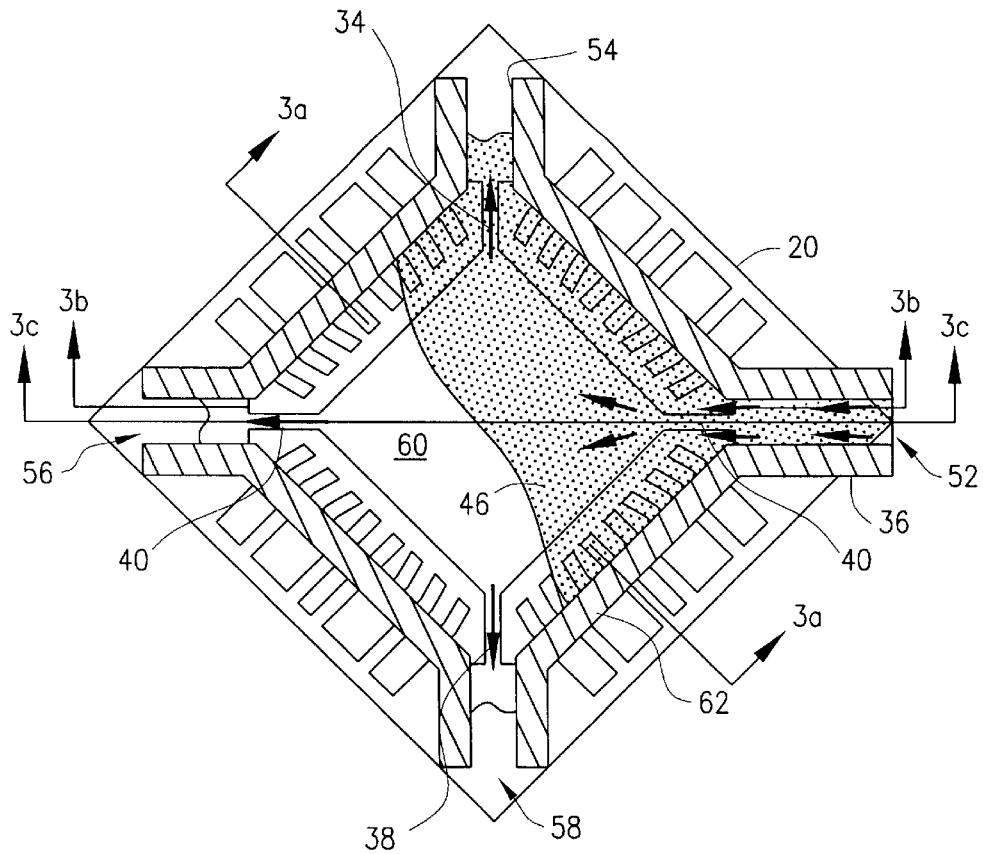
FIG. 3 is a bottom view of the prior art top mold of FIG. 3 receiving encapsulating material during an encapsulation phase.

To form a semiconductor package, a semiconductor chip must be adhered to the leadframe 20. To form the semiconductor package, a semiconductor chip (FIG. 4a–c) is mounted onto chip paddle 32. The leadframe 20 is positioned between a top mold 47 (FIGS. 2a, 2b, 3a–c) and a bottom mold (not shown) where the semiconductor chip 45 is encapsulated by an encapsulating material 46. Top mold 47 is designed to clamp onto dam bar 42 (FIG. 1) of the leadframe 20 and a portion of internal leads 26 (FIG. 1) with a sill 48 that protrudes down from the top mold plate 50 (FIG. 2). Sill 48 forms a mold gate 52 and a plurality of mold vents 54, 56 and 58 (FIG. 3). Mold gate 52 extends further outwardly than do mold vents 54, 56 and 58. Sill 48 surrounds a cavity 60 (FIGS. 2 and 2a) in which the semiconductor chip 45 (FIGS. 3a–3c) is encapsulated with encapsulation material 46. A cross sectional view of top mold 47, is shown in FIG. 2a, which is taken along lines 2a—2a of FIG. 2. A further cross sectional view shown in FIG. 2b is taken along line 2b—2b in FIG. 2a and shows the sill contact surfaces 62 of sill 48.

Figure 3A:
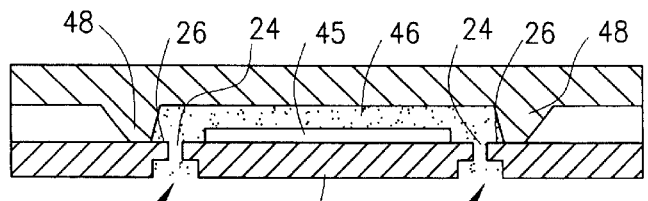
FIG. 3a is a cross-sectional view of the prior art top mold of FIG. 3 taken along line 3a—3a of FIG. 3.
Figure 3B:
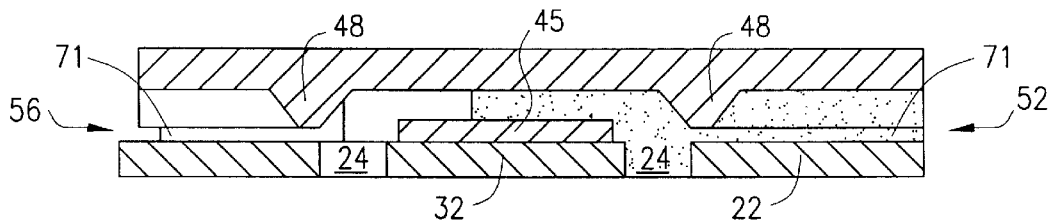
FIG. 3b is a cross-sectional view of the prior art top mold of FIG. 3 taken along line 3b—3b of FIG. 3.
Figure 3C:
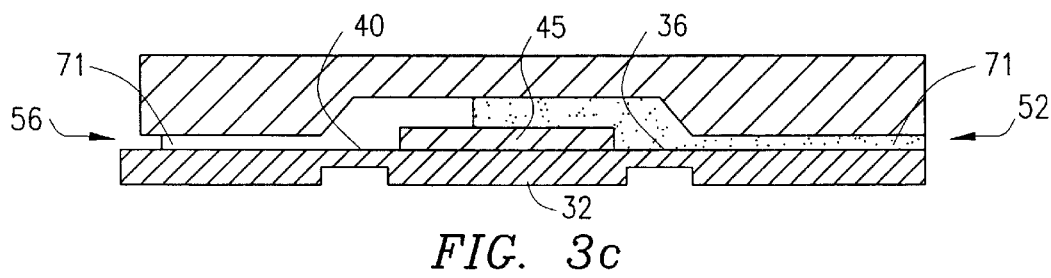
FIG. 3c is a cross-sectional view of the prior art top mold of FIG. 3 taken along line 3c—3c of FIG. 3.

Referring now to FIGS. 3 through 3c, the process of encapsulating the semiconductor chip with encapsulating material 46 is shown. Sill contact surface 62 of top mold 47 is shown clamping leadframe 20. Sill contact surface 62 is positioned to clamp dam bars 42 and metal frame body 22 (FIG. 1). Encapsulating material 46 is shown in FIG. 4, being introduced through mold gate 52. Encapsulation material 46 can be thermoplastics or thermoset resins, with thermoset resins including silicones, phenolics, and epoxies. Mold vents 54, 56 and 58 allow discharge of gas and dregs of the encapsulation material 46. The semiconductor chip 45 is not shown in FIG. 3, but is visible in FIGS. 3a, 3b and 3c. FIGS. 3a–3c show semiconductor chip 45 being encapsulated by encapsulation material 46. FIG. 3a is a cross sectional view taken along lines 3a—3a of FIG. 3. In FIG. 3a, encapsulation material 46 can be seen surrounding semiconductor chip 45 and flowing through inner voids 24 into groove 44. FIG. 3b is a cross sectional view taken along lines 3b—3b of FIG. 3. Line 3b—3b is a sectional line passing through the ends of internal voids 24. The four-corner areas of leadframe 20 are not clamped by the sill contact surfaces 62 of the top mold 47. The encapsulating material 46 flows through mold gate 52, along the upper surface of the leadframe 20, across tie bar 36 and into the cavity 60. Gas and encapsulating material 46 escape through the mold vents 54, 56 and 58. The escape path for gas and encapsulating material may be seen in FIG. 3.

Figure 4A:
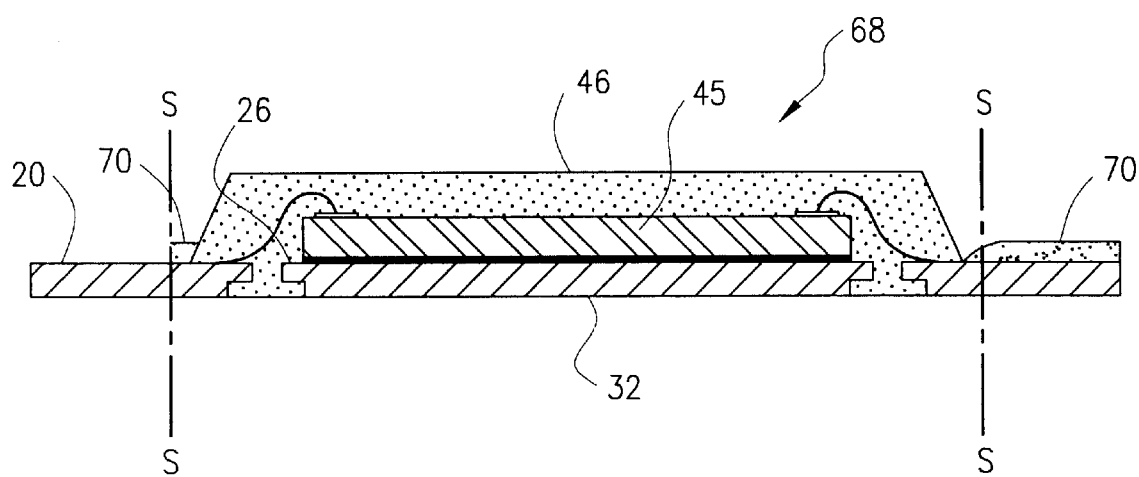
FIG. 4a is a cross-sectional view of prior art encapsulated semiconductor package encapsulated by the method shown in FIGS. 3—3c.
Figure 4B:
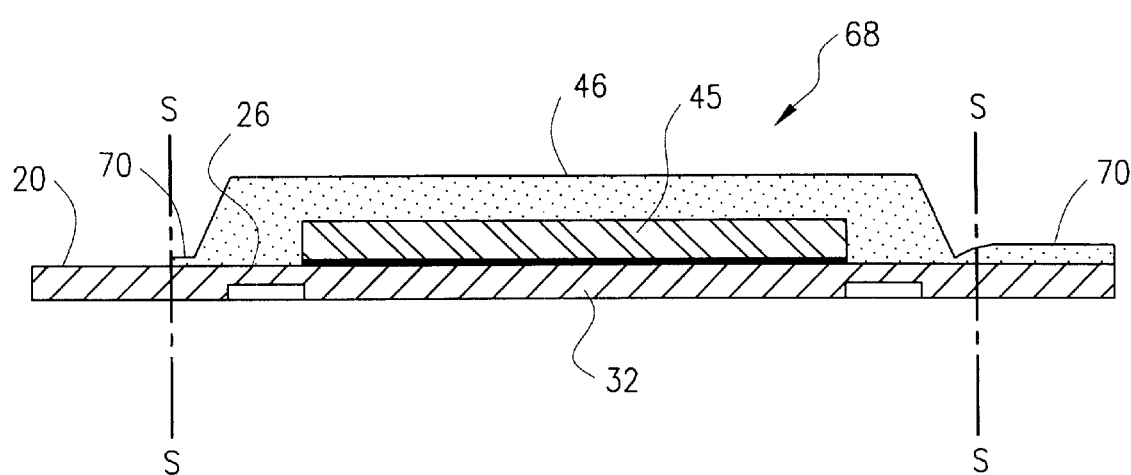
FIG. 4b is a cross-sectional view of prior art encapsulated semiconductor package encapsulated by the method shown in FIGS. 3–3c.
Figure 5:
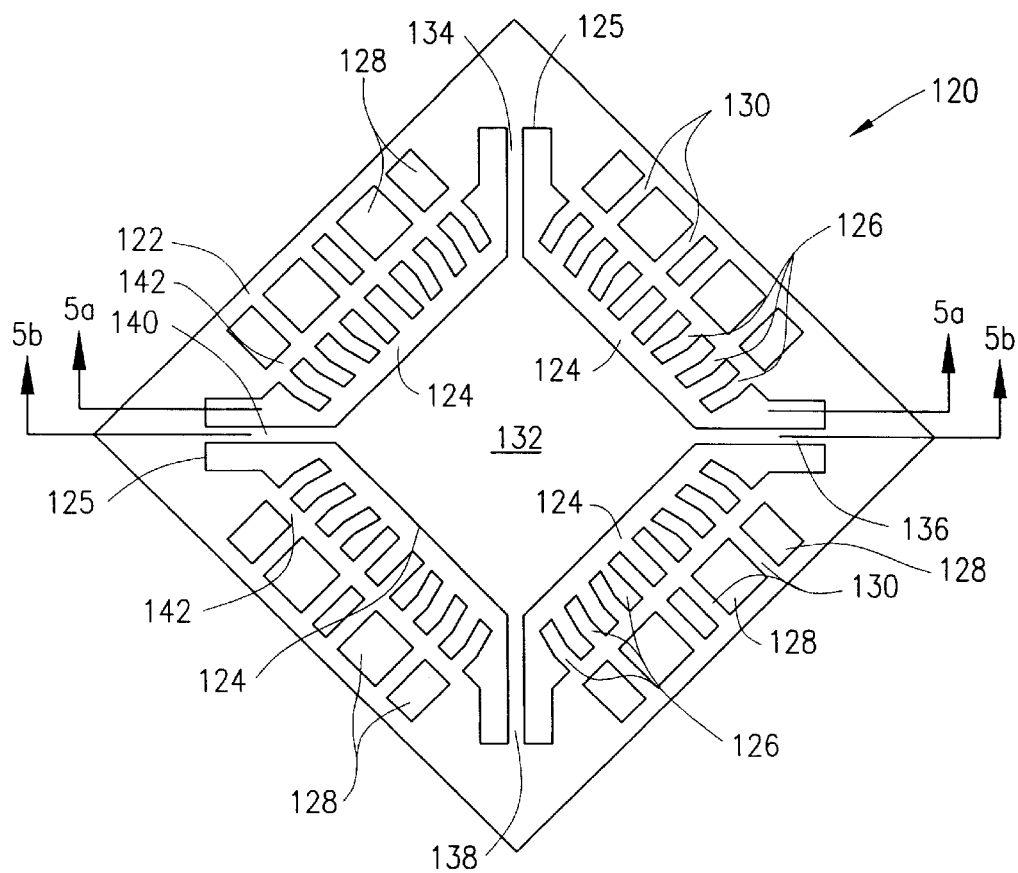
FIG. 5 is a top view of a leadframe of the invention.
Figure 5A:
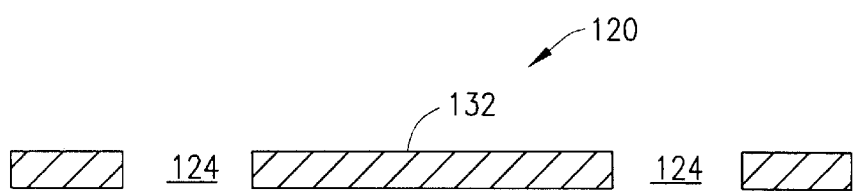
FIG. 5a is a cross-sectional view of the leadframe of FIG. 5 taken along line 5a—5a of FIG. 5.
Figure 5B:
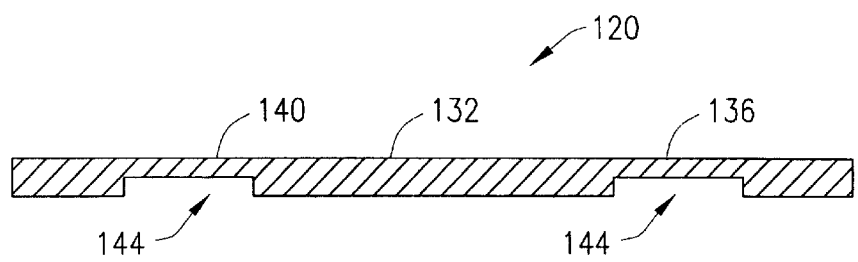
FIG. 5b is a cross-sectional view of the leadframe of FIG. 5 taken along line 5b—5b of FIG. 5.

After completion of the encapsulation process, an encapsulated semiconductor package 68 (FIG. 4a) is formed. Encapsulated semiconductor package 68 is shown in a cross-sectional view similar to that seen in FIG. 3b. Encapsulated semiconductor package 68 may also be seen in FIG. 4b which is a view similar to the cross-sectional view shown in FIG. 3c. In FIGS. 4a and 4b, overflow encapsulation material, or flash 70, is visible. Reference lines S—S are provided to indicate where the singulation process acts upon the encapsulated semiconductor package 68. The portion of flash 70 that is outside reference lines S—S may be removed when the leadframe 20 is ejected from top mold 47 and the bottom mold. Flash 70 shown in FIGS. 5a and 5b is not uniform in thickness due to various factors such as molding pressure, molding period of time, temperature, etc. The flash 70 that is present inside of reference lines S—S may cause problems during the singulation of leadframe 20. The singulation process will be explained in greater detail below. The flash 70 is formed in the cavity 60 between the top mold 47 and the frame body 22 at locations of mold vents 54, 56 and 58. Gaps 71 are visible in FIGS. 3b and 3c.

Figure 6:
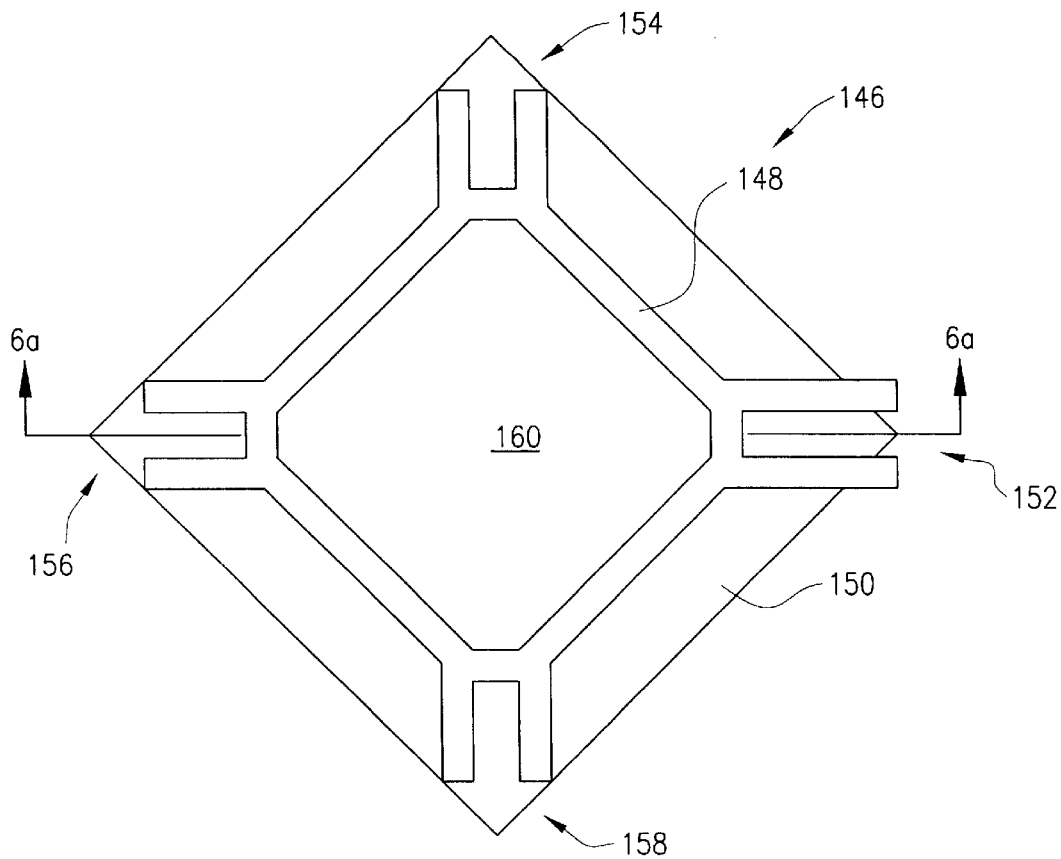
FIG. 6 is a bottom view of a top mold of an embodiment of the present invention used in an encapsulation process during the manufacture of a semiconductor package.

Referring now to FIGS. 5–9, an embodiment of an exemplary an apparatus and process that embodies the present invention will now be discussed. FIG. 6 shows a leadframe 120 that has a plate type metal frame body 122. Portions of metal frame body 122 are removed from the frame body 122, which create a plurality of voids therein. Leadframe 120 has a plurality of inner voids 124 having elongated ends 125 as compared to prior art inner voids 24 (FIG. 1). Leadframe 120 additionally has a plurality of outer voids 128 formed therein. Outer voids 128 define a plurality of external leads 130. Inner voids 124 define a chip paddle 132, which is typically square. Adjacent inner voids 124 define tie bars 134, 136, 138 and 140, which communicate chip paddle 132 with the portion of metal frame body 122 that is outside of inner voids 124. The plurality of internal leads 126 are offset from and surround the perimeter of chip paddle 132. Dam bars 142 are formed between the outer edge of inner voids 124 the inner edge of outer voids 128. Dam bars 142 are provided to prevent a molding material from flowing over the external leads 130 upon encapsulating. Elongated ends 125 extend beyond dam bars 142 toward the corners of leadframe 120. Leadframe 120 has a groove 144 formed on its underside. Groove 144 can be seen in the cross section in FIG. 5b, which is a cross sectional view of FIG. 5 taken along line 5b—5b. Line 5b—5b cuts through tie bars 136 and 140. Groove 144 can be seen passing beneath tie bars 136 and 140 of FIG. 5b. FIG. 5a shows a cross sectional view of leadframe 120 taken along lines 5a—5a of FIG. 5. Line 5a—5a passes through inner void 124 proximate tie bars 136 and 140.

Figure 6A:
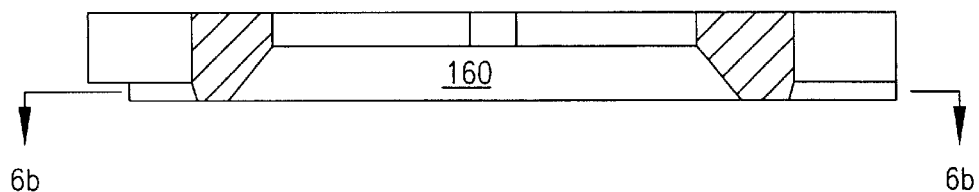
FIG. 6a is a cross sectional view of the top mold of FIG. 6 taken along line 6a—6a of FIG. 6.
Figure 7:
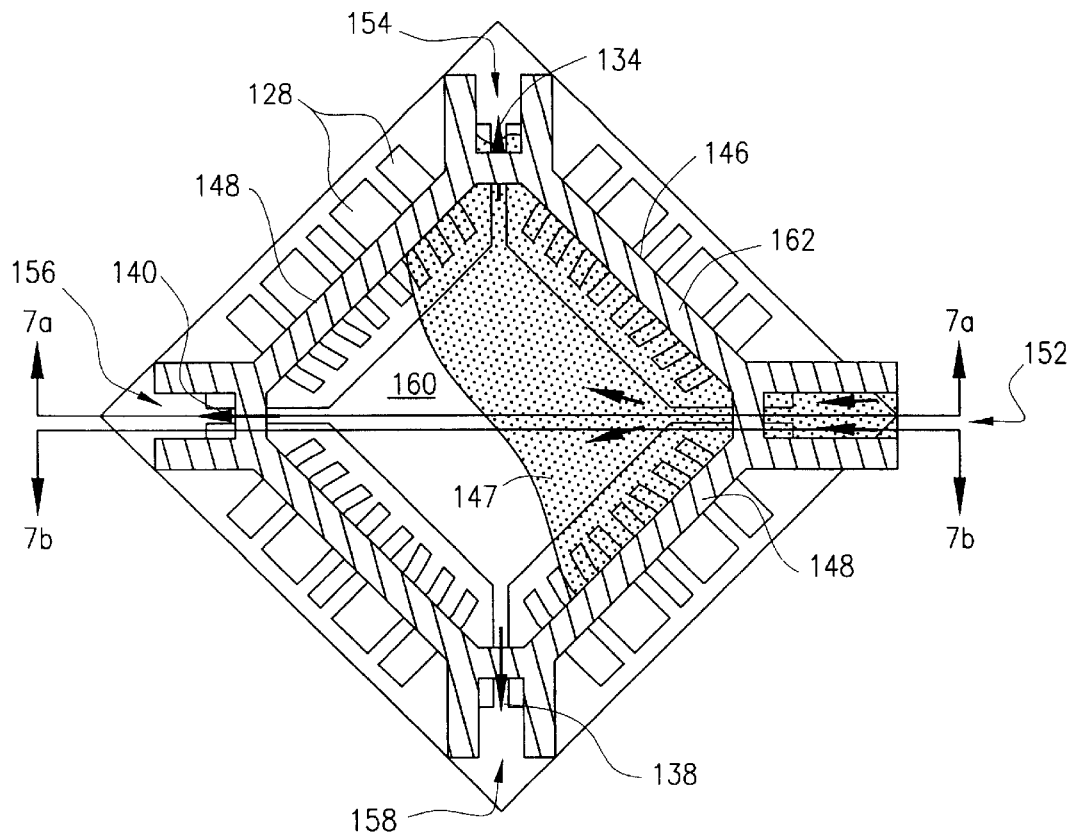
FIG. 7 is a partial cross-sectional view of the leadframe of FIG. 5 being clamped by the top mold of FIG. 6 during an encapsulation process.
Figure 7A:
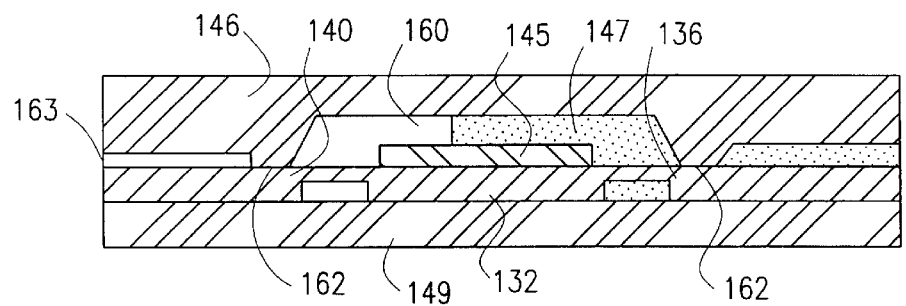
FIG. 7a is a cross-sectional view of the leadframe and top mold of FIG. 7 taken along line 7a—7a of FIG. 7 and of a bottom mold.
Figure 7B:
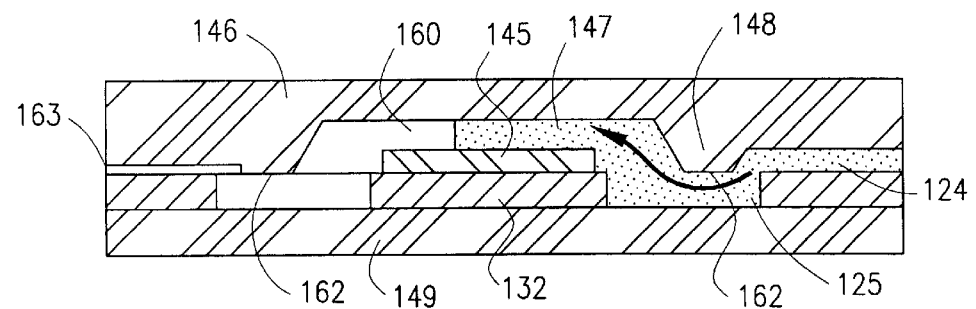
FIG. 7b is a cross-sectional view of the leadframe and top mold of FIG. 7 taken along line 7b—7b of FIG. 7.

After mounting a semiconductor chip 145 (FIGS. 7a and 7b) to chip paddle 132, chip paddle 132 and leadframe 120 are positioned between a top mold 146 (FIG. 6) and a bottom mold 149 (FIGS. 7a and 7b) and encapsulated by an encapsulating material 147 (FIGS. 7, 7a and 7b). Encapsulating material 147 can be thermoset plastics or thermoset resins, with thermoset resins including silicones, phenolics, and epoxies. Top mold 146 is designed to clamp the dam bar 142 of the leadframe 120 and part of the internal leads 126 (FIG. 5) with a sill 148, which protrudes down from the top mold plate 150 (FIGS. 6 and 7). Sill 148 forms a mold gate 152 and a plurality of mold vents 154, 156 and 158. Sill 148 forms a cavity 160 (FIGS. 6 and 6a) in which the semiconductor chip 145, wires, etc., are encapsulated with the encapsulation material 147. A cross sectional view of cavity 160 can be seen in FIG. 6a, which is taken along lines 6a—6a of FIG. 6.

Figure 6B:
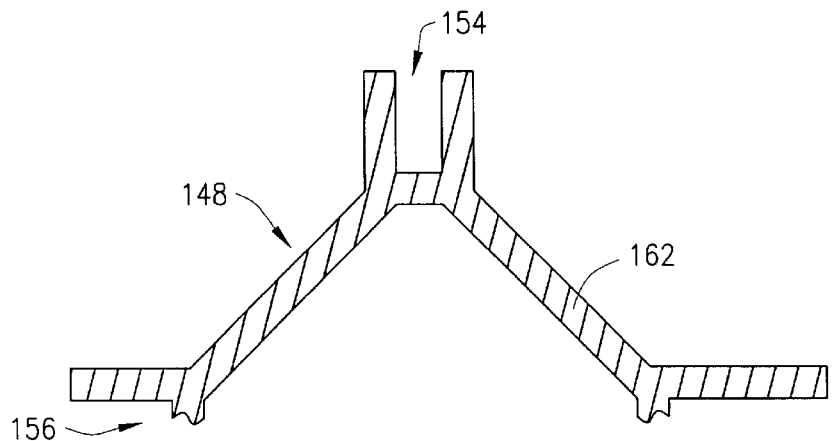

FIG. 6b is a cross-sectional view of FIG. 6a taken along line 6b—6b in FIG. 6a. Sill 148 has a tetragonal shape and is chamfered in the area of the bars 134–140. FIG. 6b shows sill contact surfaces 162 of sill 148.

Referring now to FIGS. 7 through 7b, the process of encapsulating the semiconductor chip 145 with encapsulating material 147 is shown. Leadframe 120 is shown being clamped by sill contact surface 162 of top mold 146. Sill contact surface 162 is positioned to apply clamping pressure to dam bars 142 and metal frame body 122. Encapsulating material 147 is shown being introduced through mold gate 152. Mold vents 154, 156 and 158 allow discharge of gas and dregs of the encapsulation material 164. The semiconductor chip 145 is not shown in FIG. 7. However, semiconductor chip 145 is visible in FIGS. 7a and 7b, where it is shown being encapsulated by encapsulation material 147. FIG. 7a is a cross sectional view taken along lines 7a—7a of FIG. 7. In FIG. 8a, encapsulation material 147 can be seen surrounding semiconductor chip 145. FIG. 7b is a cross sectional view taken along lines 7b—7b of FIG. 7. Line 7b—7b crosses through elongated ends 125 of inner voids 124.

When encapsulation material 147 enters through mold gate 152, the encapsulation material 147 must pass below sill 148 (see FIG. 7 and 7b) before entering cavity 160 Gas that is to be vented is allowed to pass through small openings 163 (FIGS. 7a & 7b) in mold vents 154, 156 and 158. However, since the openings 163 are small and substantially restrict flow of encapsulation material 147, the occurrence of flash is reduced.

In the cross sectional view of FIG. 7a, taken along the line 7b—7b of FIG. 7, all tie bars 134–140 are brought into close contact with the sill contact surface 162 of sill 148, so that the encapsulation material 147 cannot flow along the upper and bottom surfaces of the tie bars 134–140. As a result, after completion of the encapsulation process, no encapsulation material flashes are found on the tie bars 134–140.

In the cross sectional view, FIG. 7b, taken along the line 7b—7b of FIG. 7, the encapsulating material 147 is shown flowing through elongated ends 125 of inner voids 124 under sill 148 and into cavity 160. Likewise, molding material gas, air and molding material flash are also discharged through to the outside. Therefore, no molding material flashes remain on the upper surfaces of the tie bars 134–140 which are brought into close contact with the sill 148 of the top mold 146.

As can be seen in FIG. 7, not only the dam bars 142, but also the tie bars 134, 136, 138 and 140 are clamped by the sill 148 of the top mold 146, thereby preventing any misalignment of the leadframe 120, and any floating of the chip paddle 132. Thus, any molding material flash on the bottom surface of the chip paddle 132 is significantly reduced.

Figure 8:
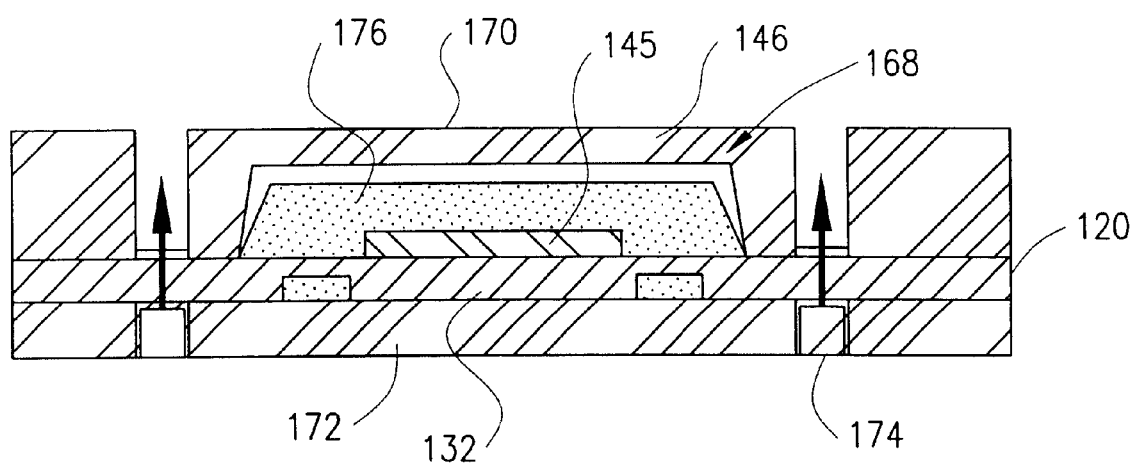
FIG. 8 is a cross-section view of an encapsulated semiconductor package of the invention undergoing singulation.

After completion of the encapsulation step, an encapsulated semiconductor package 168 (FIG. 8) is formed. Encapsulated semiconductor package 168 is shown in the cross-sectional view similar to that shown in prior art FIG. 3c. The encapsulated semiconductor package 168 is shown in FIG. 8 undergoing a singulation process.

As shown, the encapsulated semiconductor package 168 is undergoing the encapsulation process and is strongly clamped between the top clamp 170 and the bottom clamp 172. The absence of the molding material flash on the leadframe 120 in the tie bar area enables the leadframe 120 to be accurately brought into close contact with the top clamp 170 and the bottom clamp 172. Therefore, the dam bars and the tie bars all can be clamped with uniform force. In this state, a singulation tool 174 is allowed to cut the dam bars and the tie bars with uniform force. Without being damaged, the package body 176 is isolated into an individual unit.

Figure 9:
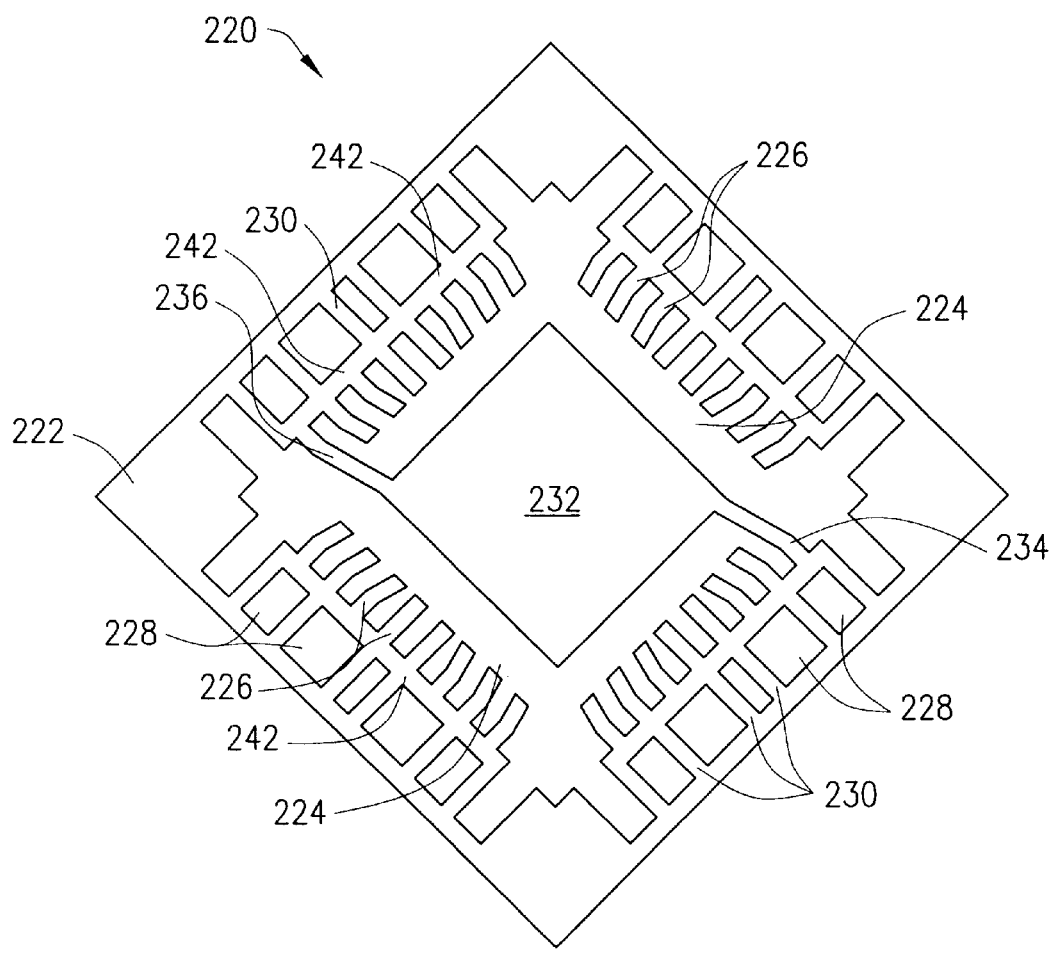
FIG. 9 is a top view of an alternative embodiment leadframe of the present invention.

FIG. 9 shows a leadframe 220 that has a plate type metal frame body 222. Portions of metal frame body 222 are removed from the metal frame body 222, which create a plurality of voids therein. Leadframe 220 has two large inner voids 224. Inner voids 224 define internal leads 226. Leadframe 220 additionally has a plurality of outer voids 228 formed therein. Outer voids 228 define a plurality of external leads 230. Inner voids 224 define a chip paddle 232. The two inner voids 224 define tie bars 234 and 236, which communicate chip paddle 232 with the portion of metal frame body 222 that is outside of inner voids 224. The plurality of internal leads 226 are offset from and surround the perimeter of chip paddle 232. Dam bars 242 are formed between the outer edge of inner voids 224 the inner edge of outer voids 228. Dam bars 242 are provided to prevent a molding material from flowing over the external leads 230 upon encapsulating.

Figure 10:
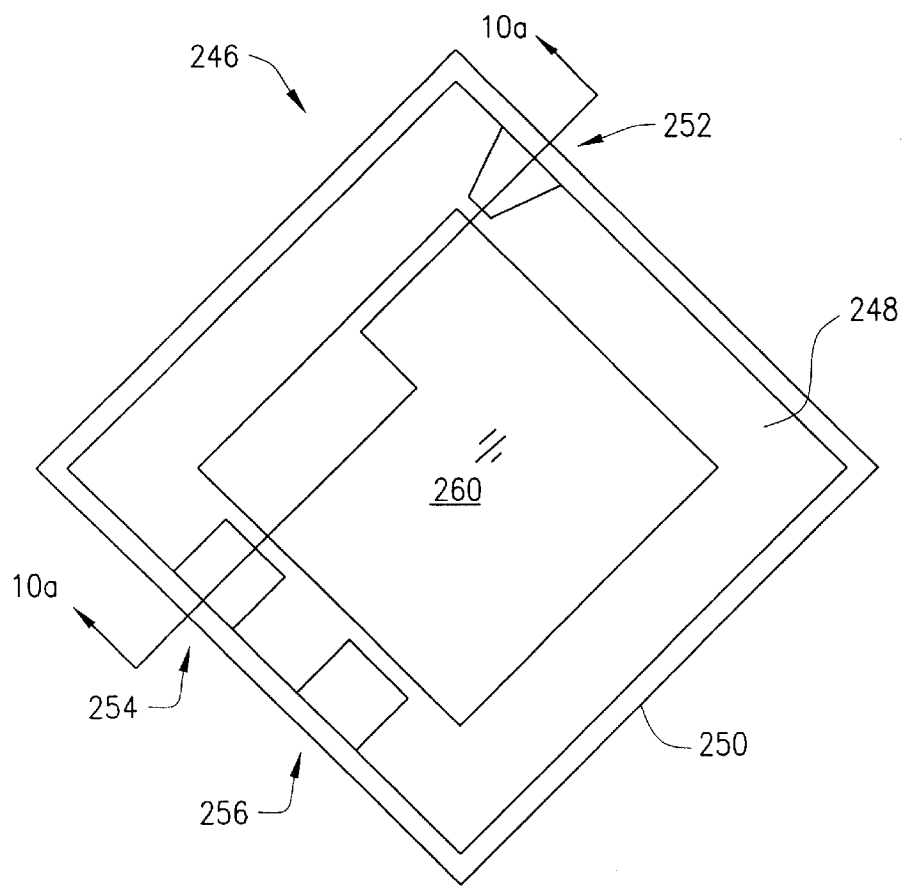
FIG. 10 is a bottom view of an alternative embodiment top mold of the present invention.
Figure 10A:
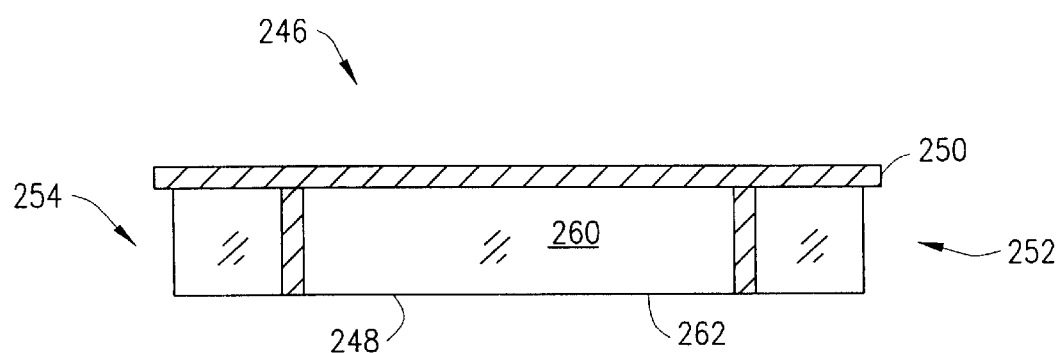
FIG. 10a is a cross-sectional view of the top mold of FIG. 10.
Figure 11:
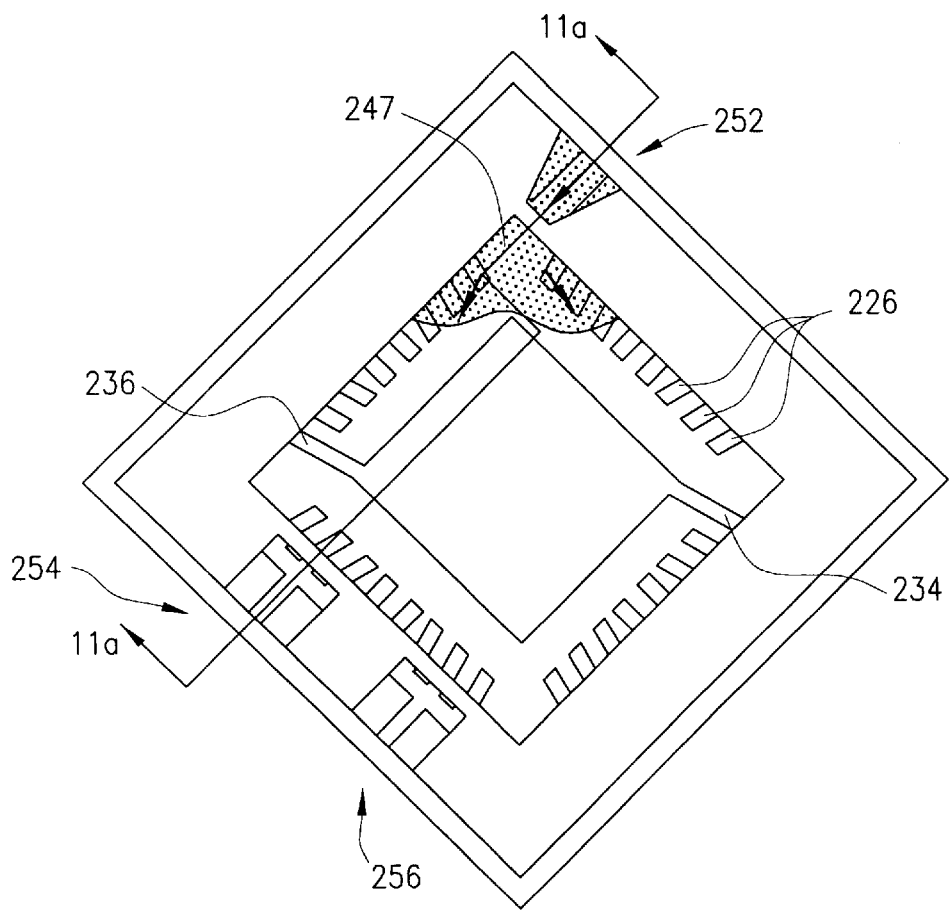
FIG. 11 is a partial cross-sectional view of the leadframe of FIG. 9 being clamped by the top mold of FIG. 10 during an encapsulation process.

After mounting a semiconductor chip to chip paddle 232, chip paddle 232 and leadframe 220 are positioned between a top mold 246 (FIGS. 10 and 10a) and a bottom mold 249 and encapsulated by an encapsulating material 247 (FIG. 11). Encapsulating material 247 can be thermoplastics or thermoset resins, with thermoset resins including silicones, phenolics, and epoxies. Top mold 246 is designed to clamp the dam bar 242 of the leadframe 220 and part of the internal leads 226 with a sill 248, which protrudes down from the top mold plate 250. Sill 248 forms a mold gate 252 and a plurality of mold vents 254 and 256. Sill 248 forms a cavity 260 (FIGS. 10 and 10a) in which the semiconductor chip, wires, etc., are encapsulated with the encapsulation material 247.

Figure 11A:
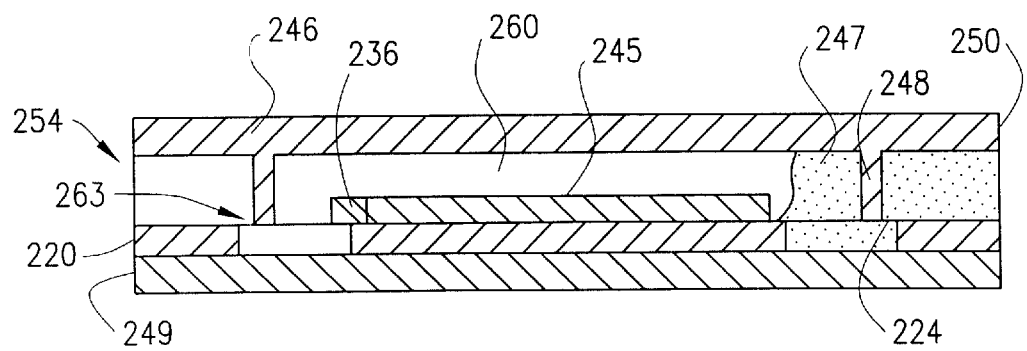
FIG. 11a is a cross-sectional view of the leadframe and top mold of FIG. 11 taken along line 11a—11a of FIG. 11 and of a bottom mold.

Referring now to FIG. 11, the process of encapsulating a semiconductor chip 245 with encapsulating material 247 is shown. Leadframe 220 is shown being clamped by sill 248 of top mold 246. Sill 248 is positioned to apply clamping pressure to dam bars and metal frame body. Encapsulating material 247 is shown being introduced through mold gate 252. Mold vents 254 and 256 allow for discharge of gas, as well as dregs, of the encapsulation material 264. The semiconductor chip 245 is not shown in FIG. 11. However, semiconductor chip 245 is visible in FIG. 11a, where it is shown being encapsulated by encapsulation material 247. FIG. 11a is a cross sectional view taken along lines 11a—11a of FIG. 11. In FIG. 11a, encapsulation material 247 can be seen surrounding semiconductor chip 245.

When encapsulation material 247 enters through mold gate 252, the encapsulation material 247 must pass below sill 248 (see FIG. 11 and 11a) before entering cavity 260. Gas is allowed to pass through small openings 263 (FIG. 11a) in mold vents 254 and 256. Small opening 263 in mold vent 254 is visible in FIG. 11a. However, small opening 263 substantially restricts flow of encapsulation material 247, thereby reducing flash.

In the cross sectional view of FIG. 11a, taken along the line 11a—11a of FIG. 11, the encapsulating material 247 is shown flowing through one of inner voids 224 under sill 248 and into cavity 260. Likewise, molding material gas, air and molding material flash are also discharged through mold vent 254 to the outside. Therefore, no molding material flash remains on the upper surfaces of the tie bars 234 and 236, which are brought into close contact with the sill 248 of the top mold 246.

As can be seen in FIG. 11, not only the dam bars 242, but also the tie bars 234 and 236 are clamped by the sill 248 of the top mold 246, thereby preventing any misalignment of the leadframe 220, and any floating of the chip paddle 232. Thus, any molding material flash on the bottom surface of the chip paddle 232 is significantly reduced.

The various embodiments of the present invention have been described in an illustrative manner, and it is to be understood that the terminology used is intended to be in the nature of description rather than of limitation. Many modifications and variations of the present invention are possible in light of the above teachings.

According to the various embodiments of the present invention, as described herein, when the leadframe is subjected to singulation after the encapsulation, no flash is found in the leadframe area of the singulation, i.e. in the areas of the dam bars and tie bars. Thus, the entire leadframe can be clamped with uniform force, resulting in a smooth singulation operation and preventing the chip-out phenomenon. The sill of the top mold clamps the dam bars as well as the tie bars, so that the chip paddle is prevented from being tilted or floated by pressure of the molding material and thus, no flashes remain on the bottom surface of the chip paddle.

The following applications are all being filed on the same date as the present application and all are incorporated by reference as if wholly rewritten entirely herein, including any additional matter incorporated by reference therein:

| Application Number | Title of Application | First Named Inventor |
| --- | --- | --- |
| 09/687,787 | Thin and Heat Radiant Semiconductor Package and Method for Manufacturing | Jae Hun Ku |
| 09/687,532 | Method for Making a Semiconductor Package Having Improved Defect Testing and Increased Production Yield | Tae Heon Lee |
| 09/687,876 | Near Chip Size Semiconductor Package | Sean Timothy Crowley |

-continued

| Application Number | Title of Application | First Named Inventor |
| --- | --- | --- |
| 09/687,536 | End Grid Array Semiconductor Package | Jae Hun Ku |
| 09/687,048 | Leadframe and Semiconductor Package with Improved Solder Joint Strength | Tae Heon Lee |
| 09/687,585 | Semiconductor Package Having Reduced Thickness | Tae Heon Lee |
| 09/687,541 | Semiconductor Package Leadframe Assembly and Method of Manufacture | Young Suk Chung |
| 09/687,049 | Improved Method for Making Semiconductor Packages | Young Suk Chung |

It is thus believed that the operation and construction of the present invention will be apparent from the foregoing description of the preferred embodiments. While the leadframe and semiconductor package shown are described as being preferred, it will be obvious to a person of ordinary skill in the art that various changes and modifications may be made therein without departing from the spirit and the scope of the invention, as defined in the following claims. Therefore, the spirit and scope of the appended claims should not be limited to the description of the preferred embodiments contained herein.

What is claimed is:

1. A semiconductor package leadframe comprising:

a frame body;

a semiconductor chip paddle, said paddle being partially defined by at least one inner void that is formed in said frame body;

at least one tie bar that communicates an outer portion of said frame body with said chip paddle; and at least one dam bar in communication with an outer surface of said at least one inner void and wherein at least one end of said at least one inner void extends outwardly beyond said at least one dam bar.

2. The leadframe according to claim 1 wherein:

said at least one tie bar is a tie bar that extends from each corner of said chip paddle towards a corner of said frame body.

3. The leadframe according to claim 1 wherein:

said at least one tie bar is a tie bar that extends from each of an opposite corner of said chip paddle.

4. The leadframe according to claim 1, comprising:

a semiconductor chip coupled to said semiconductor chip paddle.

5. An upper die mold for fabricating a semiconductor package, said mold comprising:

a base plate having at least one sill protruding from a face of said base plate, said sill defining a cavity and having a contact surface on a distal end thereof, wherein said cavity is completely enclosed when said contact surface is mated against a flat surface for the containment of encapsulate.

6. The upper die mold according to claim 5 further comprising:

a mold gate defined by a portion of said sill.

7. The upper mold die according to claim 5 further comprising:

a mold vent defined by a portion of said sill.

8. The upper mold die according to claim 5 wherein:
said sill clamps substantially exclusively onto a die bar of a leadframe when said upper mold engages the leadframe.

9. The upper mold die according to claim 5 wherein:
said sill is tetragonal in shape.

10. The upper mold die according to claim 5 wherein:
said sill clamps onto said dam bar, a plurality of inner leads and a plurality of outer leads of a leadframe when said upper mold engages the leadframe.

11. The upper mold die according to claim 10, wherein said sill is chamfered where said sill clamps onto said plurality of inner and outer leads.

12. The upper mold die according to claim 10, wherein encapsulation material flash is prevented from forming between the sill and the dam bar, the plurality of inner leads, and the plurality of outer leads of the leadframe when the upper mold engages the leadframe.

13. The upper mold die according to claim 10, wherein the clamping of the sill to the dam bar, the plurality of inner leads and the plurality of outer leads aligns the leadframe and prevents floating of the chip paddle, thereby significantly reducing formation of flash on a bottom surface of the chip paddle.

14. The upper mold die according to claim 10, wherein the sill clamps onto the dam bar, the plurality of inner leads and the plurality of outer leads of the leadframe with uniform force.

15. A top mold and a leadframe comprising in combination:
   a substantially fully enclosed cavity having relatively small openings for ingress of encapsulating material and egress of gas;
   wherein said substantially fully enclosed cavity is defined by a sill on a top mold and an upper surface of a leadframe;
   wherein said openings in said cavity are at least partially defined by a contact surface on a distal end of said sill and an inner void formed in said frame body;
   wherein the leadframe comprises:
      a frame body;
      a semiconductor chip paddle;
      at least one tie bar that communicates an outer portion of the frame body with the chip paddle; and
      at least one dam bar formed on a perimeter of the chip paddle.

16. The combination according to claim 15 wherein:
said opening defines a flow path for said encapsulating material, said flow path adjacent a tie bar of said leadframe.

17. The combination according to claim 15, wherein the relatively small openings substantially restrict flow of encapsulation material and accordingly reduce the occurrence of flash formed on the leadframe.

18. A packaged semiconductor that comprises:
   a frame body;
   a semiconductor chip paddle, said paddle being partially defined by at least one inner void that is formed in said frame body;
   at least one tie bar that communicates an outer portion of said frame body with said chip paddle; and
   at least one dam bar in communication with an outer surface of said at least one inner void and wherein at least one end of said at least one inner void extends outwardly beyond said at least one dam bar.

19. The packaged semiconductor according to claim 18 wherein:
the at least one tie bar is a tie bar that extends from each corner of the chip paddle towards a corner of the frame body.

20. The packaged semiconductor according to claim 18 wherein:
the at least one tie bar is a tie bar that extends from each of an opposite corner of the chip paddle.

* * * * *